US012648485B2

(12) United States Patent
Park et al.

(10) Patent No.: US 12,648,485 B2
(45) Date of Patent: Jun. 2, 2026

(54) SEMICONDUCTOR PACKAGE

(71) Applicant: Samsung Electronics Co., Ltd.,
Suwon-si (KR)

(72) Inventors: Minkyeong Park, Suwon-si (KR);
Sangsub Song, Suwon-si (KR); **Kihong
Jeong**, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 438 days.

(21) Appl. No.: 18/128,871

(22) Filed: Mar. 30, 2023

(65) Prior Publication Data

US 2023/0343746 A1      Oct. 26, 2023

(30) Foreign Application Priority Data

Apr. 26, 2022    (KR) ........................ 10-2022-0051269

(51) Int. Cl.
H01L 25/065 (2023.01)
H01L 23/00 (2006.01)
(Continued)

(52) U.S. Cl.
CPC ...... H01L 25/0652 (2013.01); H01L 23/5386
(2013.01); H01L 24/08 (2013.01);
(Continued)

(58) Field of Classification Search
CPC ......... H01L 24/85; H01L 24/09; H01L 24/08;
H01L 24/32; H01L 23/5386; H01L 25/0652; H01L 24/48; H01L 24/73; H01L
24/49; H01L 25/18; H01L 23/5383; H01L
23/49816; H01L 23/3128; H01L 21/78;
(Continued)

(56) References Cited

U.S. PATENT DOCUMENTS 9,437,586 B2     9/2016   Hong
9,899,347 B1 *   2/2018   Mostovoy ............... H01L 24/48
(Continued)

FOREIGN PATENT DOCUMENTS

JP        2020-053655 A      4/2020
KR     10-2005-0026397 A    3/2005
KR     10-2015-0085687 A    7/2015

*Primary Examiner* — Mouloucoulaye Inoussa
(74) *Attorney, Agent, or Firm* — Muir Patent Law, PLLC

(57) ABSTRACT

A semiconductor package includes a substrate, a first chip
structure disposed on the substrate, a second chip structure
disposed on the substrate, at least one controller disposed
between the first chip structure and the second chip structure, the at least one controller including edge pads disposed
on edges opposing each other in a first direction, and center
pads disposed between the edge pads, and bonding wire
structures. The substrate includes first bonding pads
arranged in a second direction, perpendicular to the first
direction, and second bonding pads arranged in the second
direction in at least one of a space between the first bonding
pads and the first chip structure and a space between the first
bonding pads and the second chip structure. The bonding
wire structures include a first bonding wire structure connecting the edge pads to the first bonding pads, and a second
bonding wire structure connecting the center pads to the
second bonding pads.

20 Claims, 11 Drawing Sheets

(51) Int. Cl.
H01L 23/538 (2006.01)
H10B 80/00 (2026.01)

(52) U.S. Cl.
CPC .............. *H01L 24/09* (2013.01); *H01L 24/32* (2013.01); *H01L 24/48* (2013.01); *H01L 24/49* (2013.01); *H01L 24/73* (2013.01); *H01L 2224/08112* (2013.01); *H01L 2224/09515* (2013.01); *H01L 2224/32145* (2013.01); *H01L 2224/32225* (2013.01); *H01L 2224/48148* (2013.01); *H01L 2224/48228* (2013.01); *H01L 2224/4903* (2013.01); *H01L 2224/73265* (2013.01); *H01L 2924/182* (2013.01); *H10B 80/00* (2023.02)

(58) Field of Classification Search
CPC ..... H01L 21/56; H01L 24/06; H01L 25/0657; H01L 25/50; H01L 23/5385; H01L 23/49; H01L 24/05; H01L 24/92; H01L 23/522; H01L 2224/73265; H01L 2924/182; H01L 2224/48228; H01L 2224/32225; H01L 2224/09515; H01L 2225/0651; H01L 2224/32145; H01L 2224/4903; H01L 2224/48148; H01L 2224/83; H01L 2225/06506; H01L 2225/06562; H01L 2224/04042; H01L 2224/08112; H01L 2224/49175; H01L 2224/49171; H01L 2224/05554; H01L 2224/48145; H01L 2224/05553; H01L 2224/0612; H01L 2924/00014; H01L 2224/48499; H01L 2924/1436; H01L 2924/181; H01L 2224/48147; H01L 2924/19105; H01L 2224/78301; H01L 2924/14511; H01L 2224/2919; H01L 2224/83191; H01L 2224/49109; H01L 2225/06575; H01L 2224/48227; H01L 2224/49112; H01L 2224/03452; H01L 2224/45147; H01L 2224/06135; H01L 2224/05647; H01L 2224/48091; H01L 2224/73215; H01L 2224/02375; H01L 2224/4813; G11C 5/025; G11C 5/04
See application file for complete search history.

(56) References Cited

U.S. PATENT DOCUMENTS

| | | | |
|---|---|---|---|
| 10,157,883 B2 | 12/2018 | Park et al. | |
| 10,262,972 B2 | 4/2019 | Lee et al. | |
| 10,522,507 B2 | 12/2019 | Ng et al. | |
| 10,748,885 B2 | 8/2020 | Akada | |
| 10,840,220 B2 | 11/2020 | Goto | |
| 11,037,879 B2 | 6/2021 | Otsuka | |
| 2013/0118542 A1* | 5/2013 | Levy | F03G 7/092 |
| | | | 60/641.1 |
| 2014/0185389 A1* | 7/2014 | Jeon | G11C 7/222 |
| | | | 365/189.05 |
| 2015/0108663 A1* | 4/2015 | Hong | H01L 23/5389 |
| | | | 257/777 |
| 2015/0200187 A1 | 7/2015 | Park et al. | |
| 2018/0174996 A1 | 6/2018 | Mostovoy et al. | |
| 2018/0277529 A1 | 9/2018 | Matsumoto | |
| 2019/0088607 A1* | 3/2019 | Wang | H01L 23/481 |
| 2020/0075543 A1* | 3/2020 | Kosaka | H01L 24/73 |
| 2020/0105734 A1* | 4/2020 | Akada | H01L 24/48 |
| 2020/0303345 A1* | 9/2020 | Goto | H01L 23/5386 |
| 2021/0242171 A1* | 8/2021 | Lee | G11C 5/04 |
| 2021/0313283 A1* | 10/2021 | Wilson | H01L 24/08 |
| 2022/0076712 A1* | 3/2022 | Park | H01L 25/0657 |
| 2022/0130793 A1* | 4/2022 | Kang | H01L 24/73 |
| 2022/0130797 A1* | 4/2022 | Kang | H01L 21/32 |
| 2022/0208729 A1* | 6/2022 | Oh | H01L 25/0657 |
| 2022/0392880 A1* | 12/2022 | Lee | H01L 25/18 |
| 2022/0415852 A1* | 12/2022 | Kang | H01L 25/18 |
| 2023/0028252 A1* | 1/2023 | Jung | H01L 24/49 |
| 2023/0107845 A1* | 4/2023 | Park | H01L 25/50 |
| | | | 257/686 |
| 2023/0139378 A1* | 5/2023 | Lee | H01L 24/33 |
| | | | 257/690 |

* cited by examiner

SEMICONDUCTOR PACKAGE

CROSS-REFERENCE TO RELATED APPLICATION(S)

This application claims benefit of priority to Korean Patent Application No. 10-2022-0051269 filed on Apr. 26, 2022 in the Korean Intellectual Property Office, the disclosure of which is incorporated herein by reference in its entirety.

BACKGROUND

One or more example embodiments relate to a semiconductor package.

Recently, there has been demand for implementation of higher performance and higher capacity of semiconductor packages mounted on electronic devices. Accordingly, a semiconductor package in which a plurality of semiconductor chips and a control chip for controlling operations of the plurality of semiconductor chips are embedded together has been developed.

SUMMARY

An aspect provides a semiconductor package with improved performance and reliability.

According to an aspect, a semiconductor package includes a substrate having first and second side surfaces opposite each other in a first direction, the substrate including a wiring circuit, a first chip structure disposed on the substrate to be adjacent to the first side surface, a second chip structure disposed on the substrate to be adjacent to the second side surface, at least a first controller disposed between the first chip structure and the second chip structure, the first controller including edge pads disposed at respective edges of the first controller, the respective edges opposite each other in the first direction, and center pads disposed between the edge pads in the first direction, and bonding wire structures extending from the first chip structure, the second chip structure, and the at least one controller toward the first side surface and the second side surface to be electrically connected to the wiring circuit of the substrate. The substrate may include first bonding pads adjacent to the edges of the first controller, the first bonding pads arranged in a second direction, perpendicular to the first direction, and second bonding pads arranged in the second direction in at least one of a space between the first bonding pads and the first chip structure and a space between the first bonding pads and the second chip structure. The bonding wire structures may include a first bonding wire structure connecting the edge pads to the first bonding pads, and a second bonding wire structure connecting the center pads to the second bonding pads.

According to another aspect, a semiconductor package includes a substrate having an upper surface on which first and second bonding pads are disposed, at least two chip structures disposed on the upper surface of the substrate and spaced apart from each other in a first direction, at least a first controller disposed between the two chip structures on the upper surface of the substrate, the first controller having an upper surface on which edge pads including at least two columns arranged in a second direction, perpendicular to the first direction, and center pads, including at least one column arranged in the second direction between the edge pads, may be provided, a first bonding wire structure connecting the edge pads to the first bonding pads, and a second bonding wire structure connecting the center pads to the second bonding pads. A distance between the second bonding pads and the at least one controller may be greater than a distance between the first bonding pads and the at least one controller.

According to another aspect, a semiconductor package includes a substrate having an upper surface on which first bonding pads, second bonding pads, and third bonding pads are disposed, at least two chip structures disposed on the upper surface of the substrate to be spaced apart from each other in a first direction, the two chip structures each including a plurality of semiconductor chips respectively having an upper surface on which pads are disposed, at least one controller disposed between the two chip structures on the upper surface of the substrate, each controller of the at least one controller having an upper surface on which edge pads including at least two columns arranged in a second direction, perpendicular to the first direction, and center pads, including at least one column arranged in the second direction between the edge pads, may be provided, a first bonding wire structure connecting the edge pads to the first bonding pads, a second bonding wire structure connecting the center pads to the second bonding pads, and a third bonding wire structure connecting the two chip structures to the third bonding pads. At least a set of the third bonding pads may include first and second bonding fingers spaced apart from each other in the first direction. The third bonding wire structure may include lower wires connecting lower semiconductor chips of the plurality of semiconductor chips and the first bonding fingers to each other, and upper wires connecting upper semiconductor chips of the plurality of semiconductor chips and the second bonding fingers to each other.

According to example embodiments, it is possible to provide a semiconductor package with improved performance and reliability.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, preferred example embodiments will be described with reference to the accompanying drawings.

Figure 1:
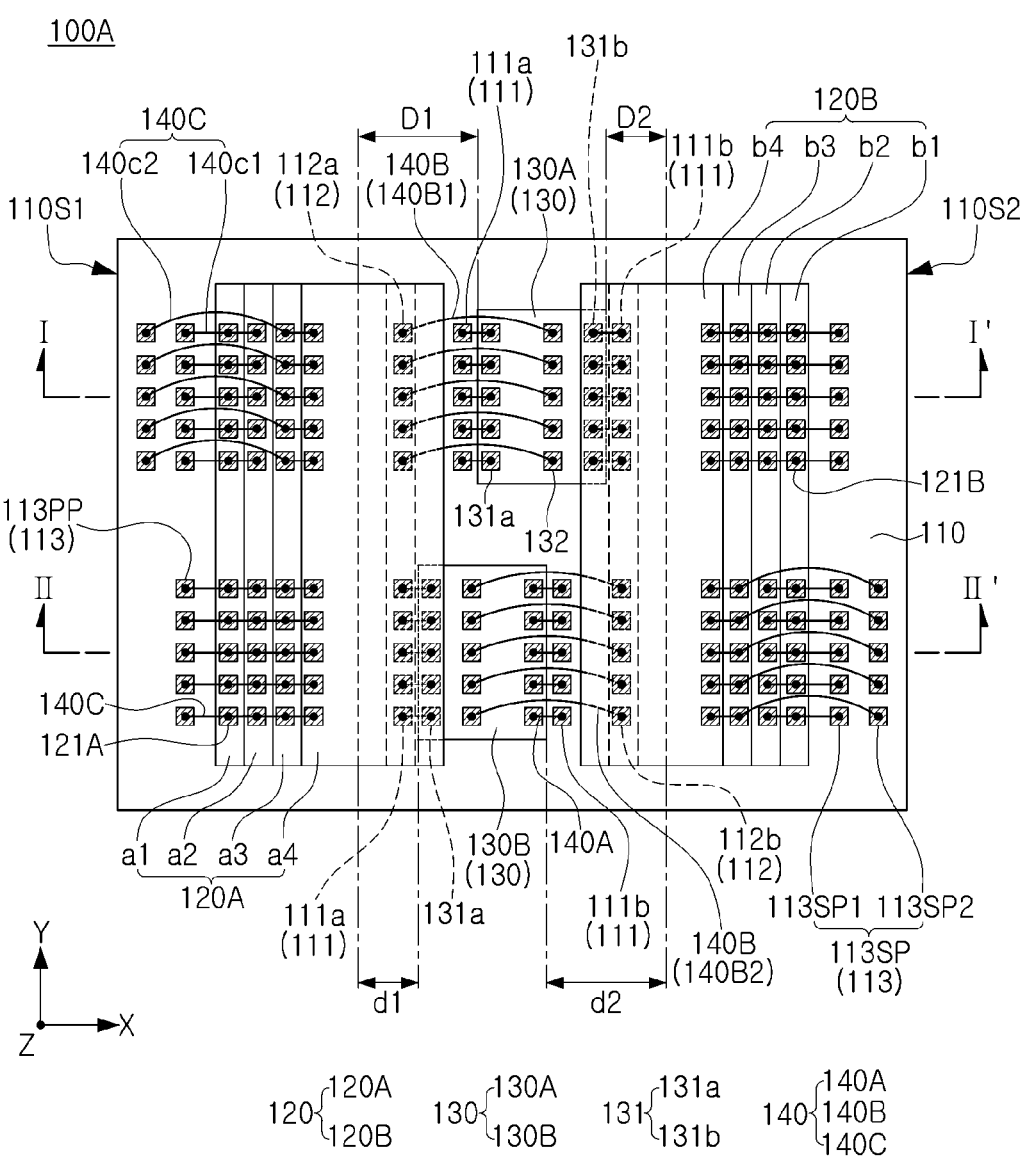
FIG. 1 is a plan view illustrating a semiconductor package according to an example embodiment.
Figure 2A:
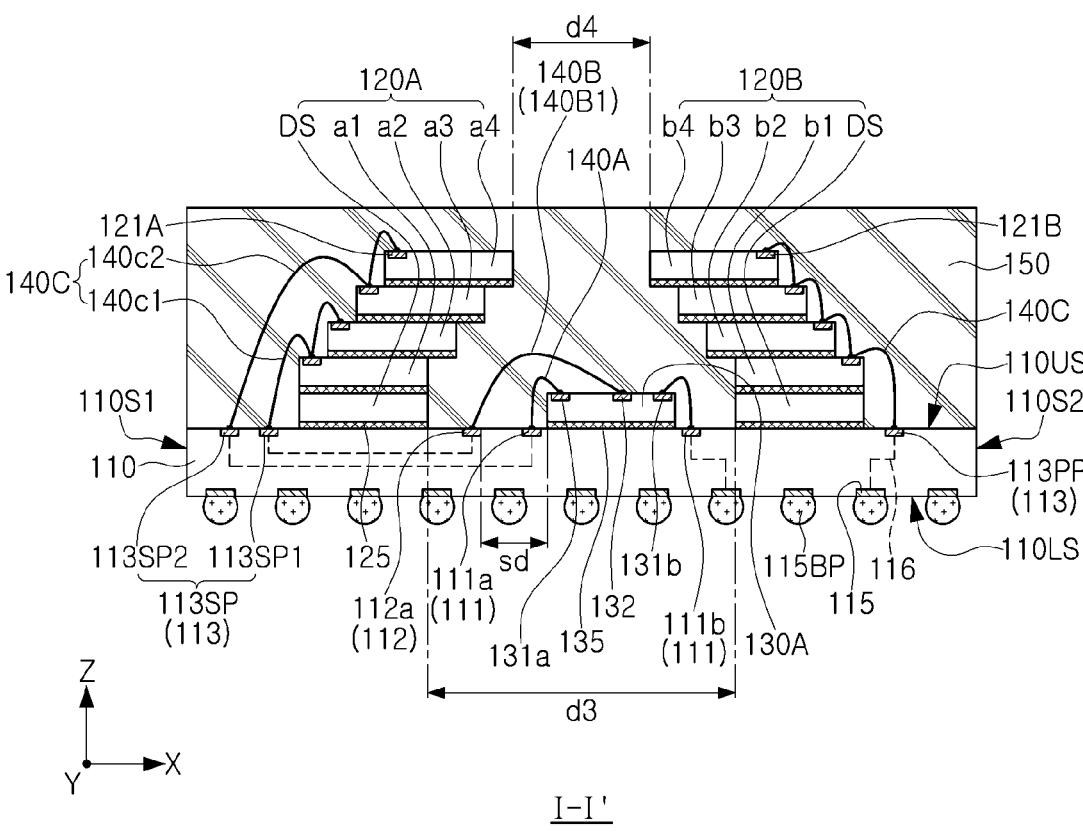
FIG. 2A is a cross-sectional view taken along line I-I' in FIG. 1.

FIG. 1 is a plan view illustrating a semiconductor package 100A according to an example embodiment. FIG. 2A is a cross-sectional view taken along line I-I' in FIG. 1, and FIG. 2B is a cross-sectional view taken along line II-II' in FIG. 1.

Figure 2B:
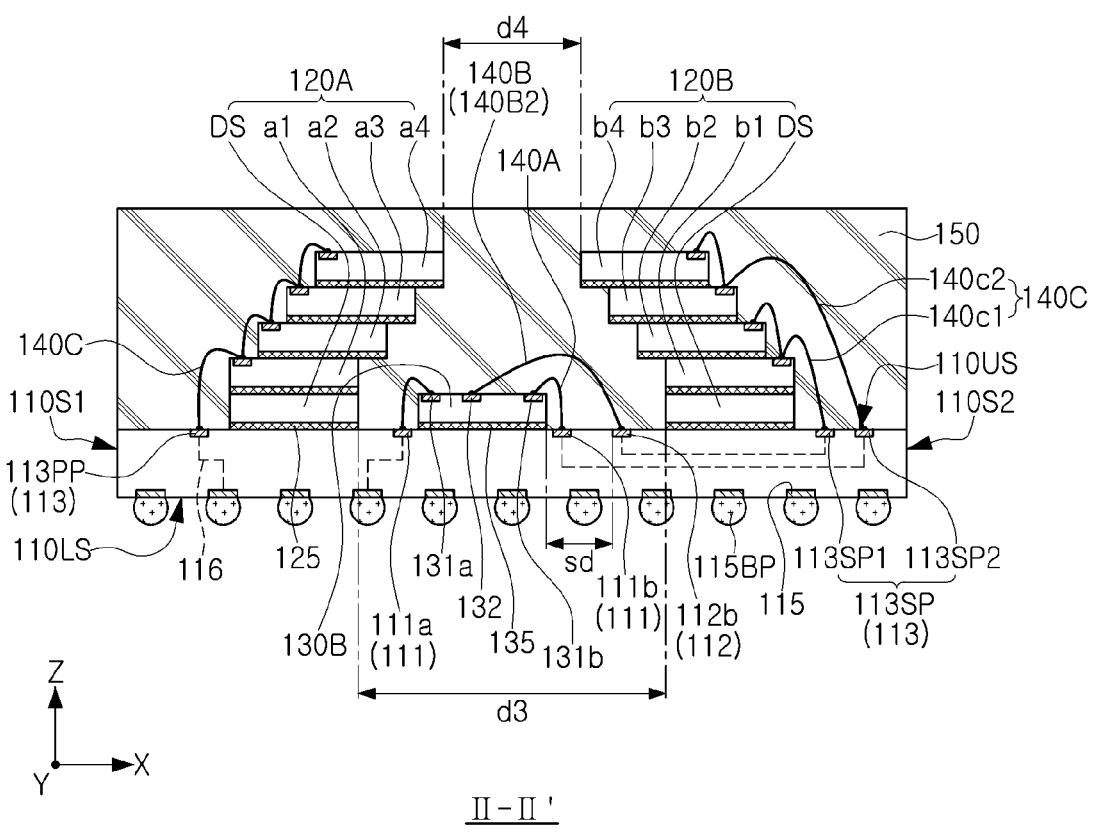
FIG. 2B is a cross-sectional view taken along line II-II' in FIG. 1.

Referring to FIGS. 1, 2A, and 2B, a semiconductor package 100A according to an example embodiment may include a substrate 110, at least a pair of chip structures 120, at least one controller 130, and bonding wire structures 140. In addition, the semiconductor package 100A may further include an encapsulant 150 sealing at least one pair of chip structures 120 and the at least one controller 130 on the substrate 110. The encapsulant 150 may protect the chip structures 120 and the controller 130 from an external environmental factors such as physical shocks or moisture. The encapsulant 150 may be formed, for example, by curing an epoxy molding compound (EMC).

In example embodiments, the at least one controller 130 may be disposed between chip structures of the at least one pair of chip structures 120, thereby reducing a chip mounting area. Here, the at least one controller 130 may be disposed in a space with an open upper portion, thereby preventing a short circuit of the bonding wire structure 140 and improving reliability of the semiconductor package 100A.

In addition, a plurality of semiconductor chips of the chip structure 120 may be divided into groups, each group communicating with a controller of the at least one controller 130 using edge pads 131 and center pads 132 of the controller, thereby improving a loading speed of the controller and improving performance of the semiconductor package 100A.

For example, the substrate 110 may include first bonding pads 111 adjacent to edges of the at least one controller 130 and arranged in a second direction (Y-direction) perpendicular to the first direction (X-direction), second bonding pads 112 arranged in the second direction (Y-direction) in at least one of a space between the first bonding pads 111 and a first chip structure 120A and a space between the first bonding pads 111 and a second chip structure 120B, and third bonding pads 113 arranged in the second direction (Y-direction) between a first side 110S1 and the first chip structure 120A and between a second side 110S2 and the second chip structure 120B. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

For example, the bonding wire structures 140 may include a first bonding wire structure 140A connecting the edge pads 131 to the first bonding pads 111, a second bonding wire structure 140B connecting the center pads 132 to the second bonding pads 112, and a third bonding wire structure 130C connecting the first pads 121A of chips of the first chip structure 120A and the second pads 121B of chips of the second chip structure 120B to the third bonding pads 113.

In one embodiment, at least a portion of the third bonding pads 113 (e.g., a set of the third bonding pads 113) may include first bonding fingers 113SP1 and second bonding fingers 113SP2 spaced apart from each other in a first direction (X-direction), and a third bonding wire structure 140C may include a lower wire 140cl connecting lower semiconductor chips a1, a2, b1, and b2 of the plurality of semiconductor chips and the first bonding fingers 113SP1 to each other, and an upper wire 140c2 connecting upper semiconductor chips a3, a4, b3, and b4 of the plurality of semiconductor chips and the second bonding fingers 113SP2 to each other. For example, communication with the lower semiconductor chips a1, a2, b1, and b2 and communication with the upper semiconductor chips a3, a4, b3, and b4 may be separated from each other, thereby improving the performance of the semiconductor package 100A.

Hereinafter, respective components of the semiconductor package 100A will be described in detail.

The substrate 110 may be a substrate for a semiconductor package including or formed of a printed circuit board (PCB), a ceramic substrate, a glass substrate, a tape wiring board, and the like. For example, the substrate 110 may be a double-sided PCB or a multilayer PCB.

The substrate 110 may have a first side 110S1 (e.g., first external side surface) and a second side 110S2 (e.g., second external side surface) opposing each other in the first direction (X-direction), and may include the first bonding pads 111, the second bonding pads 112, and the third bonding pads 113 disposed on an upper surface 110US, bump pads 115 disposed on a lower surface 110LS, and a wiring circuit 116 electrically connecting the first bonding pads 111, the second bonding pads 112, the third bonding pads 113, and the bump pads 115 to each other. The first bonding pads 111, the second bonding pads 112, the third bonding pads 113, and the bump pads 115 may include or be formed of an alloy including at least one metal or two or more metals among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), and may have a shape including a flat outer surface facing away from the substrate 110. The top surface of the first bonding pads 111, the second bonding pads 112, and the third bonding pads 113, and the bottom surface of the bump pads 115 may be coplanar with the respective top and bottom surfaces of the substrate 110. Connection bumps 115BP, also described as external connection terminals, may be disposed on lower portions of the bump pads 115. The connection bumps 115BP may include or be formed of, for example, tin (Sn) or an alloy (for example, Sn—Ag—Cu) including tin (Sn). The connection bumps 115BP may be electrically connected to an external device such as a module board or a system board.

The first bonding pads 111 may include rows of pads arranged in the second direction (Y-direction) to be adjacent to edges of the at least one controller 130 opposing each other in the first direction (X-direction). For example, for each controller of the at least one controller 130, the first bonding pads 111 may include a first group 111a arranged in the second direction (Y-direction) and disposed between the first side 110S1 of the substrate 110 and the controller, and a second group 111b arranged in the second direction (Y-direction) and disposed between the second side 110S2 of the substrate 110 and the controller. For each controller of the at least one controller 130, the first bonding pads 111 may be electrically connected to the edge pads 131 of the controller through the first bonding wire structure 140A. The first bonding pads 111 may be electrically connected to the at least one pair of chip structures 120 and to the bump pads 115 through the wiring circuit 116. The first bonding pads 111 may include pads for signals, pads for power, and pads for ground.

The second bonding pads 112 may be arranged in rows in the second direction (Y-direction) between the first bonding pads 111 and the at least one pair of chip structures 120. For example, a row of second bonding pads 112 may be between a first group of bonding pads of the first bonding pads 111 and one chip structure of the at least one pair of chip structures. Another row of second bonding pads 112 may be between a second group of bonding pads of the first bonding pads 111 and another chip structure of the at least one pair of chip structures. Second bonding pads 112 may be disposed to be more adjacent to (e.g., closer to) a chip structure of the at least one pair of chip structures 120 than to a controller of at least one controller 130 to which they are connected. For example, a distance sd in the first direction (X-direction) between the second bonding pads 112 and the at least one controller 130 may be greater than a distance in the first direction (X-direction) between the first bonding pads 111 and the at least one controller 130. The second bonding pads 112 may be electrically connected to the center pads 132 of the controller 130 through the second bonding wire structure 140B. The second bonding pads 112 may be electrically connected to the at least one pair of chip structures 120 through the wiring circuit 116. The second bonding pads 112 may include pads for signals.

The third bonding pads 113 may be adjacent to edges of the substrate 110 spaced apart from each other in the first direction (X-direction), and may be arranged in the second direction (Y-direction). For example, the third bonding pads 113 may be arranged in the second direction (Y-direction) between the first side 110S1 of the substrate 110 and the first chip structure 120A and between the second side 110S2 of the substrate 110 and the second chip structure 120B. The third bonding pads 113 may be electrically connected to the at least one pair of chip structures 120 through the third bonding wire structure 140C. The third bonding pads 113 may be electrically connected to the edge pads 131 and the center pads 132 of the controller 130 through the wiring circuit 116.

The third bonding pads 113 may include pads for signal, pads for power, and pads for ground. For example, at least some of the third bonding pads 113 may be pads for signal 113SP including the first bonding fingers 113SP1 and the second bonding fingers 113SP2, and the rest of the third bonding pads 11 may be pads for power or ground 113PP.

The first bonding fingers 113SP1 and the second bonding fingers 113SP2 may be disposed to be more adjacent to (e.g., closer to) respective sides of the substrate 110 opposing each other than to the at least one pair of chip structures 120. For example, the first bonding fingers 113SP1 may be disposed to be adjacent to the first chip structure 120A or the second chip structure 120B, and the second bonding fingers 113SP2 may be disposed between the first bonding fingers 113SP1 and the first side 110S1 or the second side 110S2 of the substrate 110. The first bonding fingers 113SP1 and the second bonding fingers 113SP2 may be connected to the second bonding pads 112 and the first bonding pads 111 through the wiring circuit 116 of the substrate 110, respectively. The first bonding fingers 113SP1 and the second bonding fingers 113SP2 may be connected to the lower semiconductor chips a1, a2, b1, and b2 and the upper semiconductor chips a3, a4, b3, and b4 through the lower wires 140c1 and the upper wires 140c2, respectively. The first bonding fingers 113SP1 may be electrically insulated from the second bonding fingers 113SP2. As described above, the first bonding fingers 113SP1 and the second bonding fingers 113SP2 are respectively connected to the center pads 132 and the edge pads 131 of the controller 130, the controller 130 may communicate with the lower semiconductor chips a1, a2, b1, and b2 and the upper semiconductor chips a3, a4, b3, and b4, separately.

The at least one pair of chip structures 120 may include a plurality of semiconductor chips disposed on an upper surface 110US of the substrate 110 to be spaced apart from each other in the first direction (X-direction), the plurality of semiconductor chips respectively having an upper surface on which pads are disposed. For example, the at least one pair of chip structures 120 may include the first chip structure 120A disposed on the substrate 110 to be adjacent to the first side 110S1, and the second chip structure 120B disposed on the substrate 110 to be adjacent to the second side 110S2. The first chip structure 120A may include a plurality of first semiconductor chips a1, a2, a3, and a4 respectively having an upper surface on which first pads 121A are disposed, and the second chip structure 120B may include a plurality of second semiconductor chips b1, b2, b3, and b4 respectively having an upper surface on which second pads 121B are disposed. The plurality of semiconductor chips may be attached to each other by an adhesive film 125 (for example, DAF). In some example embodiments, the at least one pair of chip structures 120 may further include a dummy chip DS disposed on lower portions of the plurality of semiconductor chips (e.g., as a bottom-most chip of a stack of chips). The dummy chip DS may be a dummy silicon spacer chip for supporting the plurality of semiconductor chips. The dummy chip DS may not have any pads or other connection terminals for connecting to other semiconductor devices, and may therefore function merely as physical support structures. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages as described herein may include a package substrate, one or more semiconductor chips, and an encapsulant formed on the package substrate and covering the semiconductor chips.

The plurality of first semiconductor chips a1, a2, a3, and a4 may be off-set and stacked in the first direction (X-direction) so that the first pads 121A are adjacent to the first side 110S1, and the plurality of second semiconductor chips b1, b2, b3, and b4 may be off-set and stacked in the first direction (X-direction) so that that the second pads 121B are adjacent to the second side 110S2. For example, for each first semiconductor chip a1, a2, a3, and a4, the first pads 121A may be between the first side 110S1 and a center of the semiconductor chip in the first direction (X-direction), and for each second semiconductor chip b1, b2, b3, and b4, the second pads 121B may be between the second side 110S2 and a center of the semiconductor chip in the first direction (X-direction). The first semiconductor chips a1, a2, a3, and a4 may have a staircase structure so that portions of upper chips of the stack (e.g., chips a2, a3, and a4) overhang the stack and bottom surfaces of the overhanging portions are exposed and face the substrate 110. The staircase structure of the first semiconductor chips may form first steps that increase in height in a direction from the first side 110S1 toward a center of the substrate 110 in the first direction (X-direction). The second semiconductor chips b1, b2, b3, and b4 may have a staircase structure so that portions of upper chips of the stack (e.g., chips b2, b3, and b4) overhang the stack and bottom surfaces of the overhanging portions are exposed and face the substrate 110. The staircase structure of the second semiconductor chips may form second steps that increase in height in a direction from the second side 110S2 toward a center of the substrate 110 in the first direction (X-direction), which direction may be opposite the corresponding direction for the first steps. The first chip structure 120A and second chip structure 120B may together form an open-ceiling tunnel, which may be an elongated tunnel extending in second direction (Y-direction) and having a ceiling portion (also described as an overhead portion or roof portion) that his partially open and that partially covers the substrate 110.

The at least one controller 130 controlling the plurality of first semiconductor chips a1, a2, a3, and a4 and the plurality of second semiconductor chips b1, b2, b3 and b4 may be disposed between the first chip structure 120A and the second chip structure 120B, for example, in the tunnel. A gap d3 between a lower portion of the first chip structure 120A and a lower portion of the second chip structure 120B may be greater than a gap d4 between an upper portion of the first chip structure 120A and an upper portion of the second chip structure 120B.

The plurality of first semiconductor chips a1, a2, a3, and a4 and the plurality of second semiconductor chips b1, b2, b3, and b4 may include for example, flash memories, phase-change random access memories (PRAM), non-volatile memory semiconductor chips such as a magnetoresistive random access memories (MRAM), a ferroelectric random access memories (FeRAM), or resistive random access memories (RRAM), or volatile memory semiconductor chips such as dynamic random access memories (DRAM) or static random access memories (SRAM), or combinations thereof.

Each controller of the at least one controller 130 may have an upper surface on which the edge pads 131 and center pads 132 are disposed. For each controller, the edge pads 131 may be between two chip structures of the at least a pair of chip structures 120 spaced apart from each other in the first direction (X-direction), and may be disposed at edges of the controller, the edges opposing each other in the first direction (X-direction). The center pads 132 for each controller may be disposed between the edge pads 131 of the controller. The edge pads 131 include two or more columns arranged in the second direction (Y-direction), and the center pads 132 may include one or more columns arranged in the second direction (Y-direction) between the edge pads 131. For example, the edge pads 131 may include first column pads 131a located closer to the first side 110S1 and second column pads 131b located closer to the second side 110S2 compared to the first column pads 131a, and the center pads 132 may include third column pads positioned between the first column pads 131a and the second column pads 131b in the first direction (X-direction). The at least one controller 130 may be attached to the upper surface 110US of the substrate 110 by an adhesive film 135 (for example, DAF). Each controller of the at least one controller 130 may have an elongated shape, longer in the second direction (Y-direction) than in the first direction (X-direction). In some embodiments, each controller may have a length in the second direction (Y-direction) at least twice the width in the first direction (X-direction) and up to five times or ten times the width in the first direction (X-direction).

In an example embodiment, the at least one controller 130 may be disposed to be adjacent to one of the at least one pair of chip structures 120. For example, the at least one controller 130 may be spaced apart from the first chip structure 120A by a first gap D1 or d1, and may be spaced apart from the second chip structure 120B by a second gap D2 or d2 greater than or equal to the first gap D1 or d1. In addition, the second bonding pads 112 may be disposed in a relatively greater gap among the first interval D1 or d1 and the second interval D2 or d2. Accordingly, a space between the at least one pair of chip structures 120 may be minimized, and the semiconductor package 100A may be miniaturized.

For example, the at least one controller 130 may include a first controller 130A and a second controller 130B that are alternately disposed in the second direction (Y-direction). For example, when viewed from the second direction (Y-direction), a portion of the first controller 130A horizontally overlaps a portion of the second controller 130B, a portion of the first controller 130A (e.g., a right side as shown in FIG. 1) does not horizontally overlap the second controller 130B, and a portion of the second controller 130B (e.g., a left side as shown in FIG. 1) does not horizontally overlap the first controller 130A. Each of the first controller 130A and 130B may be partly underneath a covered portion of the tunnel created by the first chip structure 120A and second chip structure 120B and partly underneath an open portion of the tunnel. The first controller 130A may include a control circuit for the first chip structure 120A, and the second controller 130B may include a control circuit for the second chip structure 120B. The first controller 130A may be disposed to be adjacent to the second chip structure 120B, and the second controller 130B may be disposed to be adjacent to the first chip structure 120A. For example, from a plan view, the first controller 130A may overlap a portion of the second chip structure 120B and may be spaced apart from the first chip structure 120A, and the second controller 130B may overlap a portion of the first chip structure 120A and may be spaced apart from the second chip structure 120B. The second bonding pads 112 may include a first group of second bonding pads 112a disposed between the first controller 130A and the first chip structure 120A, and a second group of second bonding pads 112b disposed between the second controller 130B and the second chip structure 120B. The second bonding wire structure 140B may include a first wire group 140B1 connecting the center pads 132 of the first controller 130A and the first group of second bonding pads 112a to each other, and a second wire group 140B2 connecting the center pads 132 of the second controller 130B and the second group of second bonding pads 112b to each other.

The at least one controller 130 may be connected to the at least one pair of chip structures 120 through the first bonding wire structure 140A, the second bonding wire structure 140B, the wiring circuit 116, and the third bonding wire structure 140C. In example embodiments, a connection path between the chip structures 120 and the at least one controller 130 may be additionally secured by introducing the second bonding wire structure 140B connecting the center pads 132 and the second bonding pads 112 to each other. The second bonding wire structure 140B may connect the center pads 132 (or "third column pads") and second bonding pads 112 to each other beyond the first column pads 131a or the second column pads 131b. The at least one controller 130 may include a memory controller determining a data processing order of a plurality of memory chips, and preventing an error and a bad sector.

The bonding wire structures 140 may include a first bonding wire structure 140A connecting the edge pads 131 to the first bonding pads 111, a second bonding wire structure 140B connecting the center pads 132 to the second bonding pads 112, and a third bonding wire structure 140C connecting the at least one pair of chip structures 120 to the third bonding pads 113. The bonding wire structures 140 may extend from the first chip structure 120A, the second chip structure 120B, and the at least one controller 130 toward the first side 110S1 and the second side 110S2 to be electrically connected to the wiring circuit 116 of the substrate 110.

The second bonding wire structure 140B may have a length longer than that of the first bonding wire structure 140A. The uppermost portion of the second bonding wire structure 140B may be at a vertical level higher than that of the uppermost portion of the first bonding wire structure 140A. The second bonding wire structure 140B may be formed above and may cover the first bonding wire structure 140A. An end of the first bonding wire structure 140A in contact with the first bonding pads 111 may be at substantially the same level as an end of the second bonding wire structure 140B in contact with the second bonding pads 112. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. Also, it will be understood that when an element is referred to as being "connected" or "coupled" to or "on" another element, or "adjacent to" another element, it can be directly connected or coupled to or on or adjacent to the other element or intervening elements may be present. In contrast, when an element is referred to as being "directly connected" or "directly coupled" to another element, or as "contacting" or "in contact with" another element, or immediately adjacent to another element, there are no intervening elements present at the point of contact.

The third bonding wire structure 140C may connect the first pads 121A and the second pads 121B to the third bonding pads 113. The third bonding wire structure 140C may include the lower wires 140c1 connecting lower semiconductor chips a1, a2, b1, and b2 of the plurality of first semiconductor chips a1, a2, a3, and a4 and the plurality of second semiconductor chips b1, b2, b3, and b4 and the first bonding fingers 113SP1 to each other, and the upper wires 140c2 connecting upper semiconductor chips a3, a4, b3, and b4 of the plurality of first semiconductor chips a1, a2, a3, and a4 and the plurality of second semiconductor chips b1, b2, b3, and b4 and the second bonding fingers 113SP2 to each other. The lower wires 140c1 and the upper wires 140c2 may be electrically insulated from each other. Accordingly, the at least one controller 130 may communicate with the lower semiconductor chips a1, a2, b1, and b2 and the upper semiconductor chips a3, a4, b3, and b4, separately.

As can be seen in FIGS. 1, 2A, and 2B, a footprint created by the at least one controller 130 may be formed between a bottom-most chip of the first chip structure 120A and a bottom-most chip of the second chip structure 120B, a space may be formed above the at least one controller 130 (e.g., above each of the first controller 130A and second controller 130B) within the tunnel formed by the first chip structure 120A and second chip structure 120B, and each of the first controller 130A and 130B may be disposed without any substrate or chip formed thereon. For example, a weight-bearing substrate is not formed to be connected to a top surface of the first controller 130A or second controller 130B, so that weight from a substrate connected to a top surface of the first controller 130A or second controller 130B does not exert pressure on either controller. For example, in some embodiments, from a plan view, a top surface of (e.g., at least part of the entire top surface of) the first and second controllers 130A and 130B contacts and is covered only with the encapsulant 150 and not with any other substrate or chip. The footprint created by the at least one controller 130 may include an area covered by the controller itself in addition to the first bonding pads 111 and second bonding pads 112 of the substrate 110 to which the at least one controller is connected. Also as shown in FIGS. 1, 2A, and 2B, the first and second wire bonding structures 140A and 140B that connect the first and second controllers 130A and 130B to the substrate 110 pass through the encapsulant 150, and do not pass through an additional insulating layer formed within the encapsulant 150.

Figure 3:
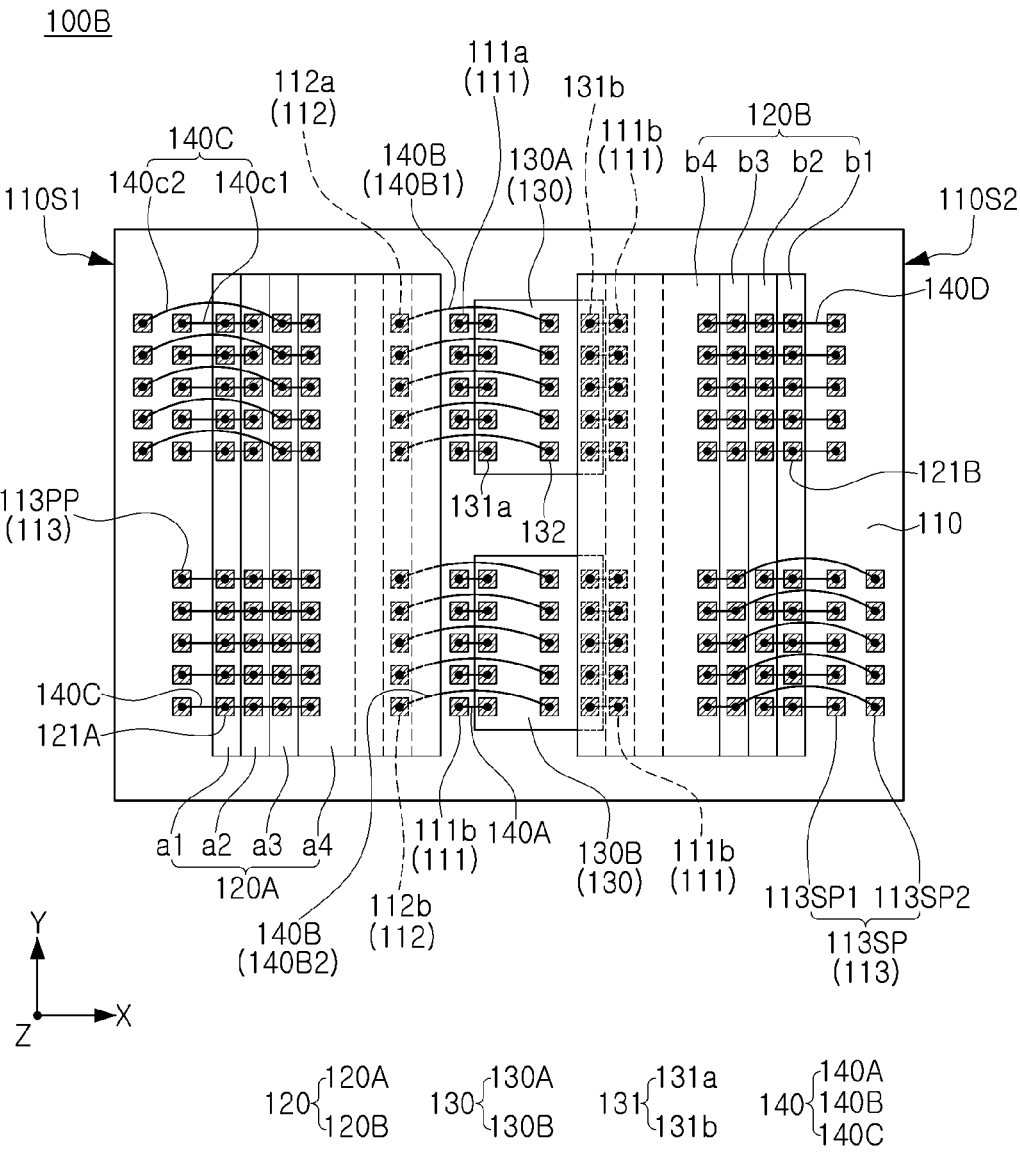
FIG. 3 is a plan view illustrating a semiconductor package according to an example embodiment.

FIG. 3 is a plan view illustrating a semiconductor package 100B according to an example embodiment.

Referring to FIG. 3, the semiconductor package 100B according to an example embodiment may have features same as or similar to those described with reference to FIGS. 1 to 2B, except that the first controller 130A and the second controller 130B are shifted in the same direction (e.g., to be fully horizontally aligned and overlapping when viewed from the second direction (Y-direction)). For example, the first controller 130A and the second controller 130B may be disposed to be closer to the second chip structure 120B than they are to the first chip structure 120A. The first group of second bonding pads 112a and the second group of second bonding pads 112b may be disposed between the first controller 130A and the first chip structure 120A and between the second controller 130B and the first chip structure 120A, respectively. Accordingly, the first wire group 140B1 and the second wire group 140B2 may extend away from the first and second controllers 130A and 130B in the same direction, for example, toward the first side 110S1. Also in the present example embodiment, the first controller 130A may include a control circuit for the first chip structure 120A, and the second controller 130B may include a control circuit for the second chip structure 120B.

Figure 4:
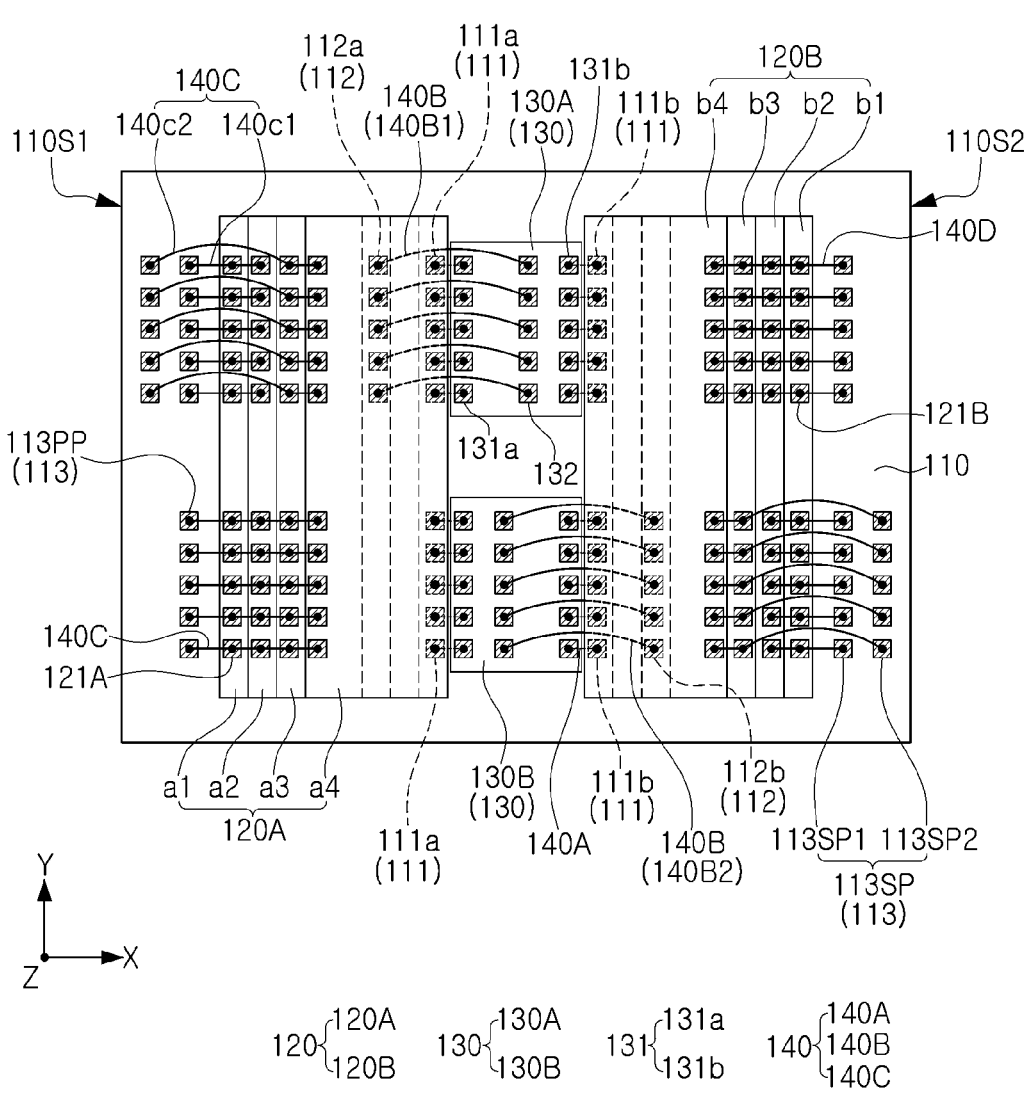
FIG. 4 is a plan view illustrating a semiconductor package according to an example embodiment.

FIG. 4 is a plan view illustrating a semiconductor package 100C according to an example embodiment.

Referring to FIG. 4, the semiconductor package 100C according to an example embodiment may have features same as or similar to those described with reference to any of FIGS. 1 to 3, except that the first controller 130A and the second controller 130B are positioned between the first chip structure 120A and the second chip structure 120B to not vertically overlap with either of the first chip structure 120A or the second chip structure 120B, and may also be aligned in the first direction (X-direction). For example, the first controller 130A and the second controller 130B may be disposed substantially on central portions of the first chip structure 120A and the second chip structure 120B. The first group of second bonding pads 112a may be disposed between the first controller 130A and the first chip structure 120A, and the second group of second bonding pads 112b may be disposed between the second controller 130B and the second chip structure 120B. Accordingly, the first wire group 140B1 and the second wire group 140B2 may extend in different directions away from the first and second controllers 130A and 130B. For example, the first wire group 140B1 may extend toward the first side 110S1, and the second wire group 140B2 may extend toward the second side 110S2. As illustrated in FIGS. 3 and 4, the first controller 130A and the second controller 130B may be disposed in various forms between the pair of chip structures 120, and positions thereof are not particularly limited.

Figure 5:
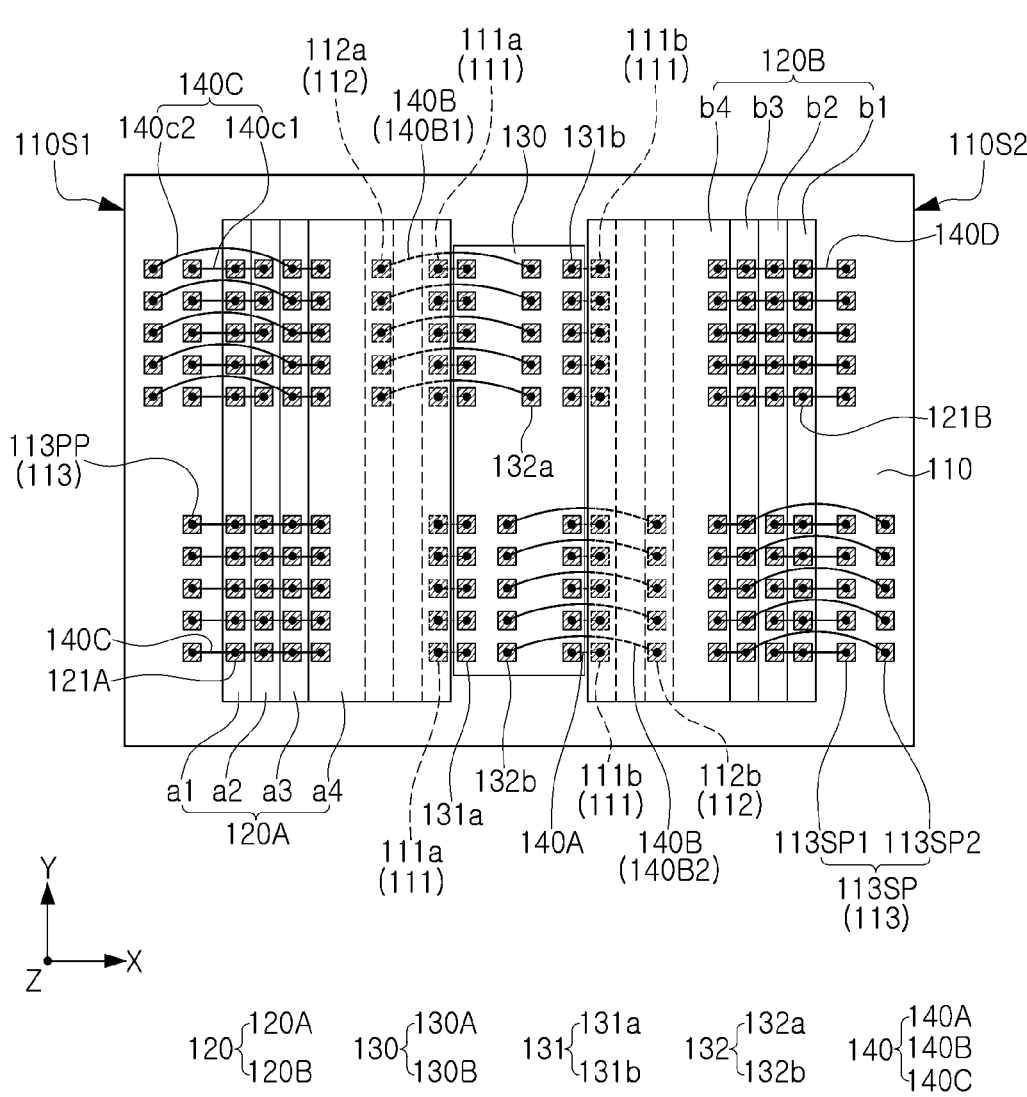
FIG. 5 is a plan view illustrating a semiconductor package according to an example embodiment.

FIG. 5 is a plan view illustrating a semiconductor package 100D according to an example embodiment.

Referring to FIG. 5, the semiconductor package 100D according to an example embodiment may have features same as or similar to those described with reference to FIGS. 1 to 4, except that one controller 130 is included. In the present example embodiment, the controller 130 may include a control circuit for the first chip structure 120A and the second chip structure 120B. The controller 130 may have an upper surface on which the edge pads 131 disposed on edges opposing each other in the first direction (X-direction), and the center pads 132 disposed between the edge pads 131 are disposed. The edge pads 131 include two or more columns arranged in the second direction (Y-direction), and the center pads 132 may include two or more columns arranged in the second direction (Y-direction) between the edge pads 131. For example, the edge pads 131 may include the first column pads 131a adjacent to the first side 110S1, and the second column pads 131b adjacent to the second side 110S2, and the center pads 132 may include third column pads 132a adjacent to the second column pads 131b, and fourth column pads 132b adjacent to the first column pads 131a. By forming the center pads 132 further from one set of edge pads than the other set of edge pads, in this embodiment and others, the wire structure (including the wires) connecting the center pads 132 to the substrate 110 can be formed to be less high and have a wider arc than if the center pads 132 were positioned equidistantly from each set of edge pads.

The controller 130 according to the present example embodiment may be disposed substantially at a central portion (in the X-direction) of the combined first chip structure 120A and second chip structure 120B. The first group of second bonding pads 112a may be disposed between the controller 130 and the first chip structure 120A, and the second group of second bonding pads 112b may be disposed between the controller 130 and the second chip structure 120B. The first wire group 140B1 and the second wire group 140B2 may extend in different directions away from the controller 130. For example, the first wire group 140B1 may connect the third column pads 132a and the first group of second bonding pads 112a to each other, and extend toward the first side 110S1, and the second wire group 140B2 may connect the fourth column pads 132b and the second group of second bonding pads 112b to each other, and extend toward the second side 110S2.

Figure 6:
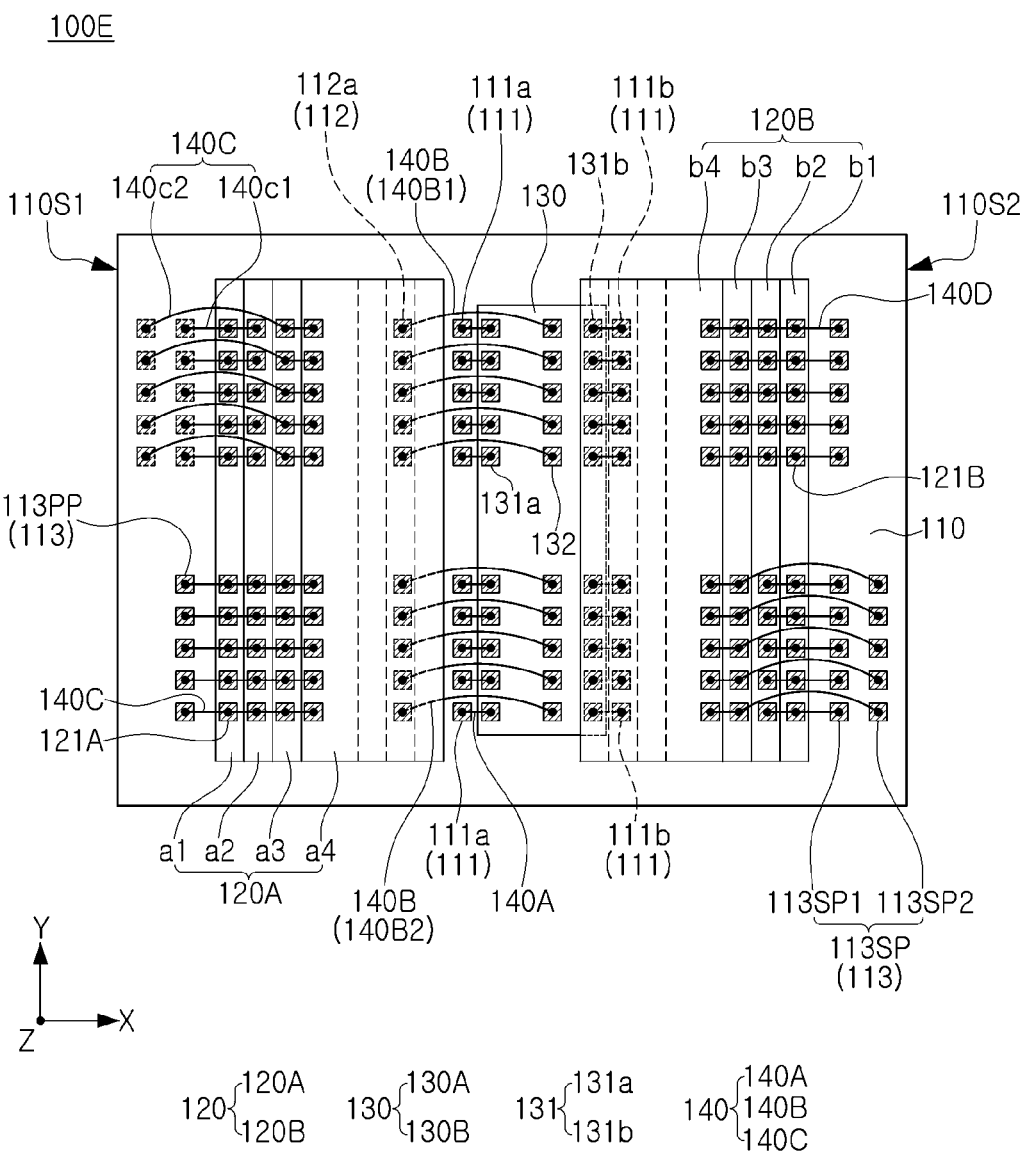
FIG. 6 is a plan view illustrating a semiconductor package according to an example embodiment.

FIG. 6 is a plan view illustrating a semiconductor package 100E according to an example embodiment.

Referring to FIG. 6, the semiconductor package 100E according to an example embodiment may have features same as or similar to those described with reference to FIGS. 1 to 5, except that the edge pads 131 and the center pads 132 on the upper surface of the controller 130 are arranged in three columns.

In the present example embodiment, the controller 130 may include a control circuit for the first chip structure 120A and the second chip structure 120B. The controller 130 may have an upper surface on which the edge pads 131 disposed on edges opposing each other in the first direction (X-direction), and the center pads 132 disposed between the edge pads 131 are disposed. The edge pads 131 include two or more columns arranged in the second direction (Y-direction), and the center pads 132 may include only one column arranged in the second direction (Y-direction) between the edge pads 131. For example, the edge pads 131 may include the first column pads 131a adjacent to the first side 110S1, and the second column pads 131b adjacent to the second side 110S2, and the center pads 132 may include third column pads positioned between the first column pads 131a and the second column pads 131b.

The controller 130 according to the present example embodiment may be disposed to be closer to one side of the pair of chip structures 120. For example, the controller 130 may be disposed to be closer to the second chip structure 120B than it is to the first chip structure 120A. The first group of second bonding pads 112a and the second group of second bonding pads 112b may be disposed between the controller 130 and the first chip structure 120A. Accordingly, the first wire group 140B1 and the second wire group 140B2 may extend in the same direction, for example, toward the first side 110S1.

Figure 7:
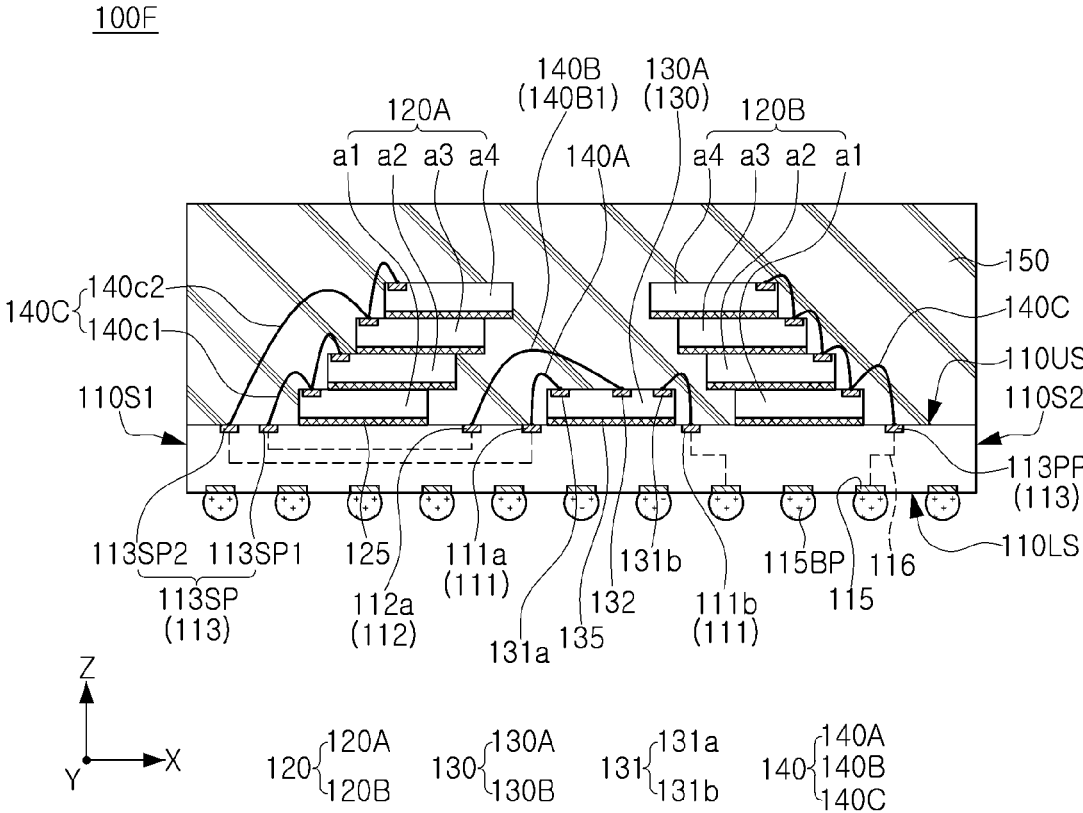
FIG. 7 is a cross-sectional view illustrating a semiconductor package according to an example embodiment.

FIG. 7 is a cross-sectional view illustrating a semiconductor package 100F according to an example embodiment. FIG. 7 illustrates a cross-sectional view of the semiconductor package 100F corresponding to FIG. 2A. It can be understood that the semiconductor package 100F according to the present example embodiment has a planar shape similar to that in FIG. 1.

Referring to FIG. 7, the semiconductor package 100F according to an example embodiment may have features same as or similar to those described with reference to FIGS. 1 to 6, except that a dummy chip ("DS" in FIG. 2A) is not included in lower portions of the at least one pair of chip structures 120. In the present example embodiment, the plurality of first semiconductor chips a1, a2, a3, and a4 and the plurality of second semiconductor chips b1, b2, b3, and b4 may be directly disposed on the upper surface 110US of the substrate 110 (e.g., without any other chips or substrates therebetween). For example, the lowermost first and second semiconductor chips a1 and b1 may be attached to the upper surface 110US of the substrate 110 by the adhesive film 125. Considering a size of the chip structure 120, a size of the controller 130, a length of the second bonding wire structure 140B, and the like, the first chip structure 120A and the second chip structure 120B may not include the dummy chips.

Figure 8:
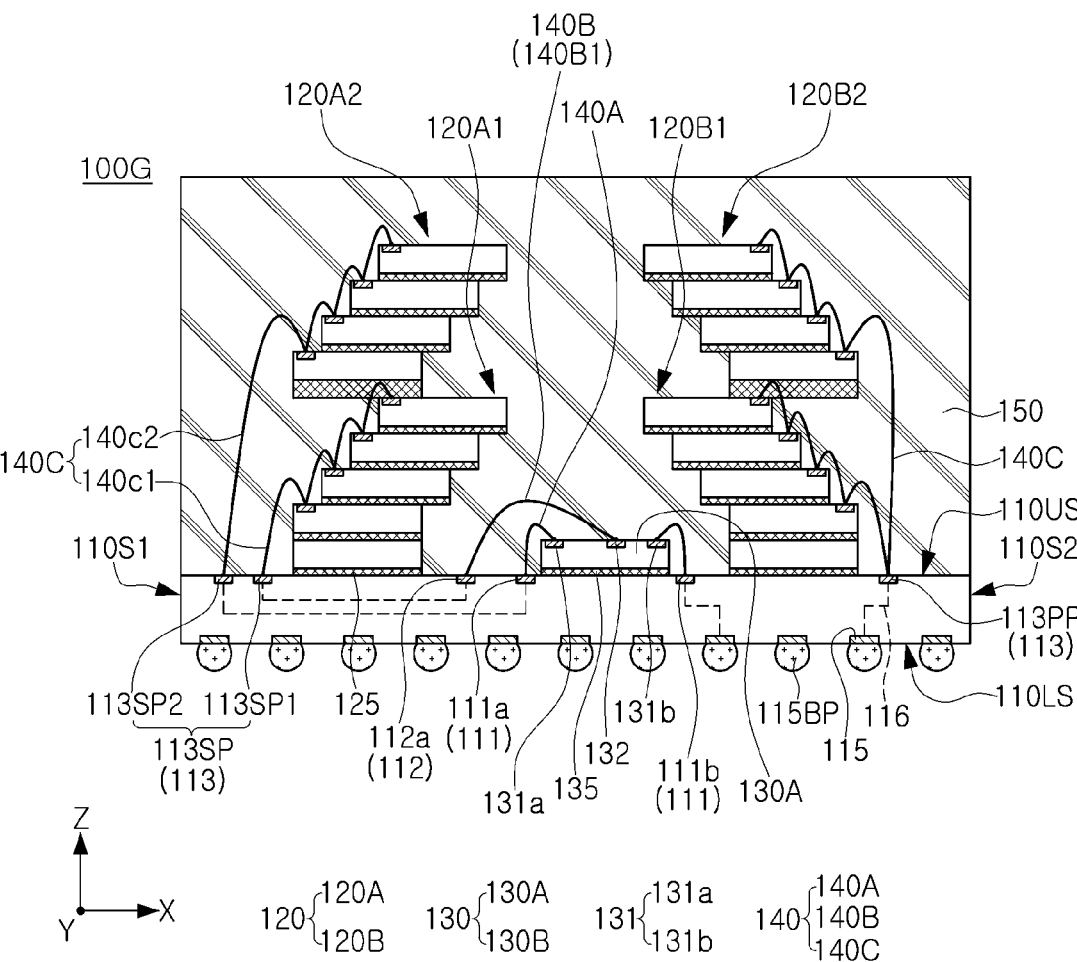
FIG. 8 is a cross-sectional view illustrating a semiconductor package according to an example embodiment.

FIG. 8 is a cross-sectional view illustrating a semiconductor package 100G according to an example embodiment. FIG. 8 illustrates a cross-sectional view of the semiconductor package 100G corresponding to FIG. 2A. It can be understood that the semiconductor package 100G according to the present example embodiment has a planar shape (e.g., a shape and size when viewed from a plan view) similar to that in FIG. 1.

Referring to FIG. 8, the semiconductor package 100G according to an example embodiment may have features same as or similar to those described with reference to FIGS. 1 to 7, except that a pair of chip structures are further included in comparison to the semiconductor package 100A in FIGS. 1 to 2B. The semiconductor package 100G according to the present example embodiment may include a first lower chip structure 120A1, a first upper chip structure 120A2, a second lower chip structure 120B1, and a second upper chip structure 120B2. In this case, four controllers 130, two controllers 130, or one controller 130 may be provided, but the present example embodiment is not limited thereto.

For example, the first lower chip structure 120A1 may be connected to the first bonding fingers 113SP1 through the lower wires 140cl, and the first upper chip structure 120A2 may be connected to the second bonding fingers 113SP2 through the upper wires 140c2. In addition, the second lower chip structure 120B1 and the second upper chip structure 120B2 may be connected to the pads for power or ground 113PP through the third bonding wire structure 140C. Here, the first bonding fingers 110SP1 and the second bonding fingers 113SP2 may be respectively connected to the edge pads 131 and the center pads 132 of the controller 130, and thus the controller 130 may communicate with the first lower chip structure 120A1, the first upper chip structure 120A2, the second lower chip structure 120B1, and the second upper chip structure 120B2, separately. In some example embodiments, the third bonding wire structure 140C may be formed so that the controller 130 separately communicates with semiconductor chips included in each chip structure (refer to the example embodiment of FIG. 1).

FIGS. 9A to 9D are cross-sectional views illustrating a manufacturing process of a semiconductor package according to an example embodiment. FIGS. 9A to 9D illustrate a manufacturing process of a cross-section of the semiconductor package 100A illustrated in FIG. 2A.

Figure 9A:
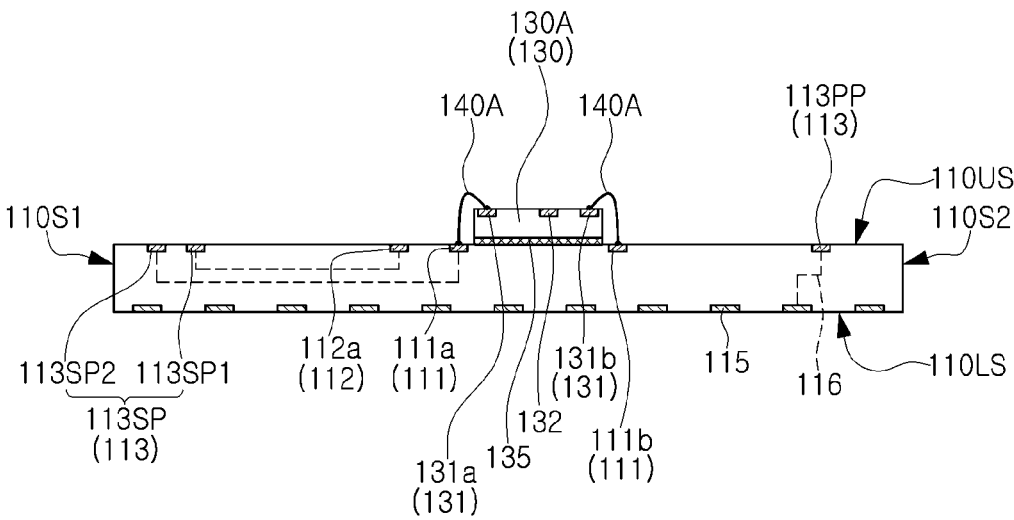
FIGS. 9A to 9D are cross-sectional views illustrating a manufacturing process of a semiconductor package according to an example embodiment.

Referring to FIG. 9A, the first controller 130A may be disposed face-up on the substrate 110. The first controller 130A may be disposed so that an upper surface thereof on which the edge pads 131 and the center pads 132 are disposed faces upward. The first controller 130A may be attached to the upper surface 110US of the substrate 110 by the adhesive film 135 disposed on a lower surface thereof.

Next, a first bonding wire structure 140A connecting the edge pads 131 to the first bonding pads 111 may be formed. The first bonding wire structure 140A may be formed by a wire bonding process using a capillary. The first bonding wire structure 140A may include or be formed of gold (Au), silver (Ag), lead (Pb), aluminum (Al), copper (Cu), or an alloy thereof.

Figure 9B:
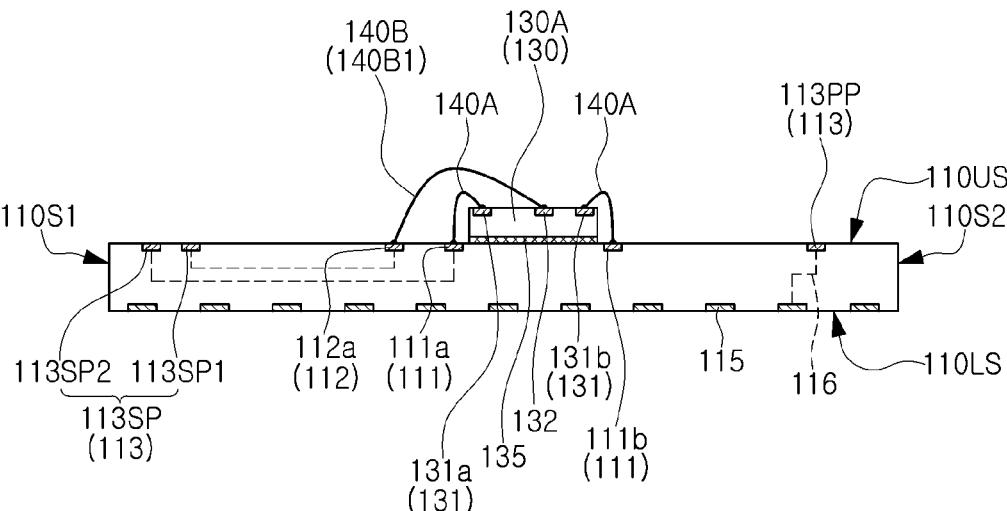

Referring to FIG. 9B, a second bonding wire structure 140B connecting the center pads 132 to the second bonding pads 112 may be formed. The second bonding wire structure 140B may be formed by the wire bonding process in a similar manner to that of the first bonding wire structure 140A, and may include or be formed of gold (Au), silver (Ag), lead (Pb), and aluminum (Al), copper (Cu), or an alloy thereof. In order to prevent a short circuit with the first bonding wire structure 140A, the second bonding wire structure 140B may extend over and beyond the first bonding wire structure 140A to the second bonding pads 112. An uppermost portion of the second bonding wire structure 140B may be at a vertical level higher than that of an uppermost portion of the first bonding wire structure 140A.

Figure 9C:
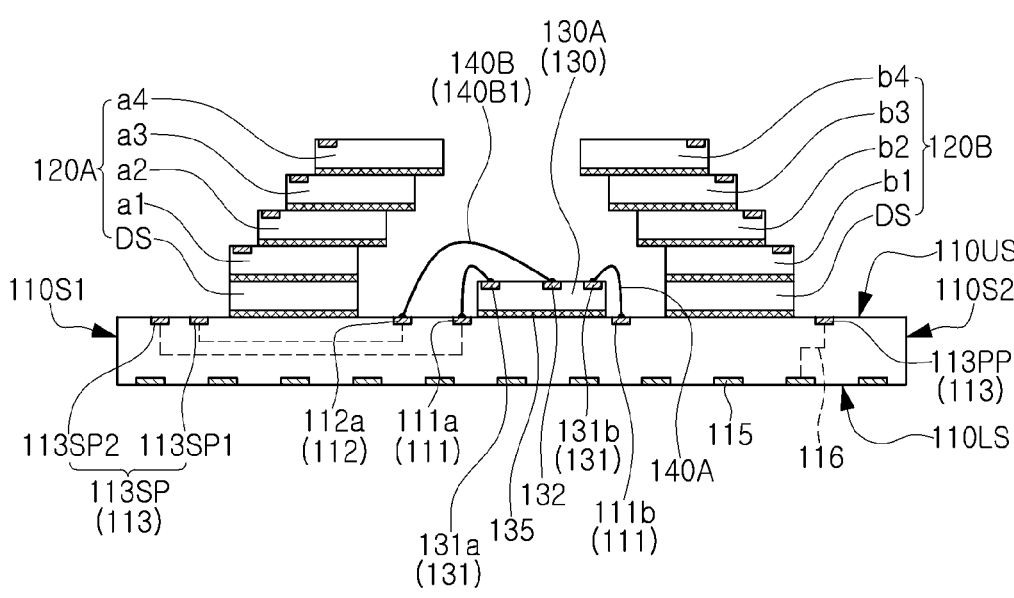

Referring to FIG. 9C, the first chip structure 120A and the second chip structure 120B may be disposed on opposite sides of the first controller 130A. The first chip structure 120A and the second chip structure 120B may be attached to the upper surface 110US of the substrate 110 by the adhesive film 125 on a lower portion of the dummy chip DS. The first chip structure 120A may include the plurality of first semiconductor chips a1, a2, a3, and a4 respectively having an upper surface on which the first pads 121A are disposed, and the second chip structure 120B may include the plurality of second semiconductor chips b1, b2, b3, and b4 respectively having an upper surface on which the second pads 121B are disposed. The plurality of first semiconductor chips a1, a2, a3, and a4 may be off-set and stacked so that the first pads 121A are adjacent to the first side 110S1, and the plurality of second semiconductor chips b1, b2, b3, and b4 may be off-set and stacked so that the second pads 121B are adjacent to the second side 110S2.

Figure 9D:
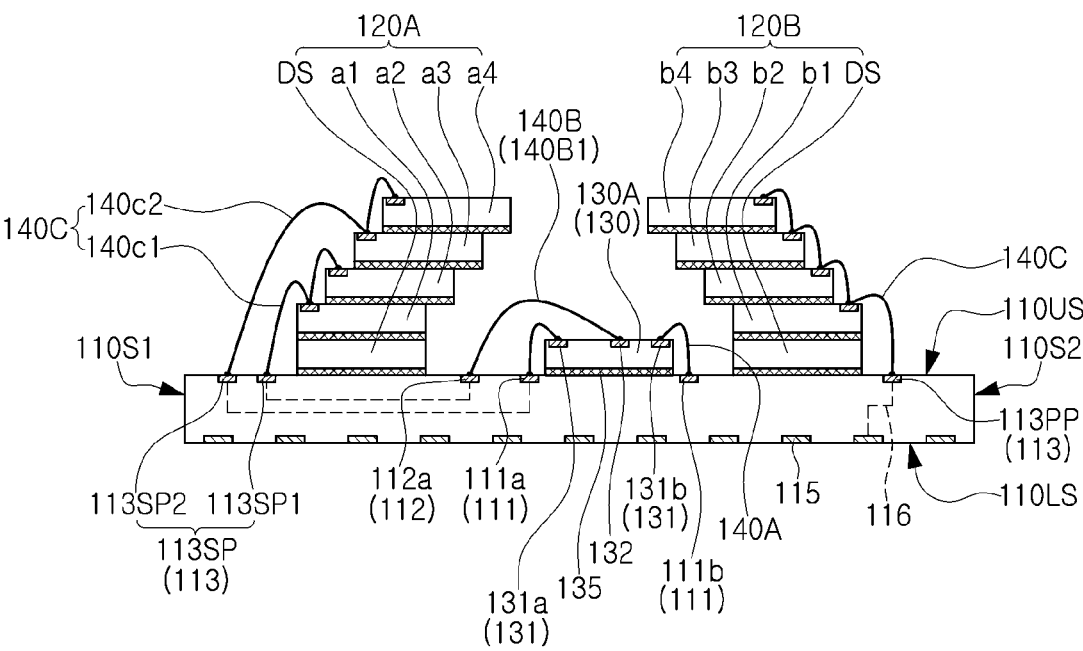

Referring to FIG. 9D, the third bonding wire structure 140C connecting the first pads 121A and the second pads 121B to the third bonding pads 113 may be formed. The third bonding wire structure 140C may include the lower wires 140cl connecting the lower semiconductor chips a1, a2, b1, and b2 to the first bonding fingers 113SP1, and the upper wires 140c2 connecting the upper semiconductor chips a3, a4, b3, and b4 to the second bonding fingers 113SP2. The lower wires 140cl and the upper wires 140c2 may be electrically insulated from each other. Accordingly, the first controller 130A may communicate with the lower semiconductor chips a1, a2, b1, and b2 and the upper semiconductor chips a3, a4, b3, and b4, separately. Thereafter, an encapsulant ("150" in FIG. 2A) and connection bumps ("115BP" in FIG. 2A) may be formed.

While example embodiments have been shown and described above, it will be apparent to those skilled in the art that modifications and variations could be made without departing from the scope of example embodiments as defined by the appended claims.

What is claimed is:

1. A semiconductor package comprising:
a substrate having first and second side surfaces opposite each other in a first direction, the substrate including a wiring circuit;
a first chip structure disposed on the substrate to be adjacent to the first side surface;
a second chip structure disposed on the substrate to be adjacent to the second side surface;
at least a first controller disposed between the first chip structure and the second chip structure, the first controller including edge pads disposed at respective edges of the first controller, the respective edges opposite each other in the first direction, and center pads disposed between the edge pads in the first direction; and
bonding wire structures extending from the first chip structure, the second chip structure, and the first controller toward the first side surface and the second side surface to be electrically connected to the wiring circuit of the substrate,
wherein the substrate includes first bonding pads adjacent to the edges of the first controller, the first bonding pads arranged in a second direction, perpendicular to the first direction, and second bonding pads arranged in the second direction in at least one of a space between the first bonding pads and the first chip structure and a space between the first bonding pads and the second chip structure, and
the bonding wire structures include a first bonding wire structure connecting the edge pads to the first bonding pads, and a second bonding wire structure directly connecting the center pads to the second bonding pads.

2. The semiconductor package of claim 1, wherein wires of the second bonding wire structure have a length greater than a length of wires of the first bonding wire structure.

3. The semiconductor package of claim 1, wherein an uppermost portion of the second bonding wire structure is at a vertical level higher than that of an uppermost portion of the first bonding wire structure.

4. The semiconductor package of claim 1, wherein an end of the first bonding wire structure in contact with the first bonding pads is at the same level as that of an end of the second bonding wire structure in contact with the second bonding pads.

5. The semiconductor package of claim 1, wherein:
the edge pads include first column pads adjacent to the first side surface and second column pads adjacent to the second side surface, and
the center pads include third column pads positioned between the first column pads and the second column pads.

6. The semiconductor package of claim 5, wherein the second bonding wire structure connects the third column pads and the second bonding pads to each other beyond the first column pads or the second column pads.

7. The semiconductor package of claim 5, wherein:
the first controller is spaced apart from the first chip structure by a first gap, and is spaced apart from the second chip structure by a second gap greater than or less than the first gap, and
the second bonding pads are disposed in a greater gap among the first gap and the second gap.

8. The semiconductor package of claim 1, further comprising,
a second controller
disposed to be adjacent to the first chip structure, and
wherein the first controller is disposed to be adjacent to the second chip structure, and
when viewed from the second direction, a portion of the first controller overlaps a portion of the second controller, a portion of the first controller does not overlap the second controller, and a portion of the second controller does not overlap the first controller.

9. The semiconductor package of claim 8, wherein:
the second bonding pads include a first group disposed between the first controller and the first chip structure, and a second group disposed between the second controller and the second chip structure, and
the second bonding wire structure includes a first wire group connecting the center pads of the first controller and the first group of the second bonding pads to each other, and a second wire group connecting the center pads of the second controller and the second group of the second bonding pads to each other.

10. The semiconductor package of claim 1, wherein:
the substrate further includes third bonding pads arranged in the second direction between the first side surface and the first chip structure and between the second side surface and the second chip structure,
the first chip structure includes a plurality of first semiconductor chips respectively having an upper surface on which first pads are disposed,
the second chip structure includes a plurality of second semiconductor chips respectively having an upper surface on which second pads are disposed, and
the bonding wire structures further include a third bonding wire structure connecting the first pads and the second pads to the third bonding pads.

11. The semiconductor package of claim 10, wherein:
at least a first group of the third bonding pads include first bonding fingers disposed to be adjacent to the first chip structure or the second chip structure, and second bonding fingers disposed between the first bonding finger and the first side surface or the second side surface, and
the third bonding wire structure includes lower wires connecting lower semiconductor chips of the plurality of first and second semiconductor chips and the first bonding fingers to each other, and upper wires connecting upper semiconductor chips of the plurality of first and second semiconductor chips and the second bonding fingers to each other.

12. The semiconductor package of claim 11, wherein the lower wires and the upper wires are electrically insulated from each other.

13. The semiconductor package of claim 11, wherein the first bonding fingers and the second bonding fingers are respectively connected to the first bonding pads and the second bonding pads through the wiring circuit of the substrate.

14. The semiconductor package of claim 11, wherein:
the first group of the third bonding pads are pads for signals, and
the remainder of the third bonding pads are pads for power or ground.

15. The semiconductor package of claim 10, wherein:
the plurality of first semiconductor chips are off-set and stacked in the first direction so that the first pads are adjacent to the first side surface, and
the plurality of second semiconductor chips are off-set and stacked in the first direction so that the second pads are adjacent to the second side surface.

16. The semiconductor package of claim 15, wherein the first chip structure and second chip structure form an open-ceiling tunnel in which the first controller is located, the open-ceiling tunnel including an opening, wherein within the tunnel, a weight-bearing substrate is not formed to be connected to a top surface of the first controller.

17. The semiconductor package of claim 1, further comprising an encapsulant covering the first chip structure, second chip structure, first controller, and bonding wire structures, and wherein at least the first bonding wire structure and second bonding wire structure pass through the encapsulant.

18. A semiconductor package comprising:
a substrate having an upper surface on which first and second bonding pads are disposed;
at least two chip structures disposed on the upper surface of the substrate and spaced apart from each other in a first direction;
at least a first controller disposed between the two chip structures on the upper surface of the substrate, the first controller having an upper surface on which edge pads including at least two columns arranged in a second direction, perpendicular to the first direction, and center pads including at least one column arranged in the second direction between the edge pads, are provided;
a first bonding wire structure connecting the edge pads to the first bonding pads; and
a second bonding wire structure connecting the center pads to the second bonding pads,
wherein a distance between the second bonding pads and the first controller is greater than a distance between the first bonding pads and the first controller.

19. The semiconductor package of claim 18, wherein:
the substrate further includes a wiring circuit electrically connected to the first and second bonding pads, and
the first controller is one of two controllers respectively electrically connected to the two chip structures through the first bonding wire structure, the second bonding wire structure, and the wiring circuit.

20. A semiconductor package comprising:
a substrate having an upper surface on which first bonding pads, second bonding pads, and third bonding pads are disposed;
at least two chip structures disposed on the upper surface of the substrate to be spaced apart from each other in a first direction, the two chip structures each including a plurality of semiconductor chips respectively having an upper surface on which pads are disposed;
at least one controller disposed between the two chip structures on the upper surface of the substrate, each controller of the at least one controller having an upper surface on which edge pads including at least two columns arranged in a second direction, perpendicular to the first direction, and center pads including at least one column arranged in the second direction between the edge pads, are provided;

a first bonding wire structure connecting the edge pads to the first bonding pads;

a second bonding wire structure connecting the center pads to the second bonding pads; and a third bonding wire structure connecting the two chip structures to the third bonding pads, wherein at least a set of the third bonding pads include first and second bonding fingers spaced apart from each other in the first direction, and wherein the third bonding wire structure includes lower wires directly connecting lower semiconductor chips of the plurality of semiconductor chips and the first bonding fingers to each other, and upper wires directly connecting upper semiconductor chips of the plurality of semiconductor chips and the second bonding fingers to each other.

* * * * *